(12) United States Patent
Takemasa

(10) Patent No.: US 12,315,855 B2
(45) Date of Patent: May 27, 2025

(54) DISPLAY DEVICE AND METHOD FOR MANUFACTURING THE SAME

(71) Applicant: Japan Display Inc., Tokyo (JP)

(72) Inventor: Kenichi Takemasa, Tokyo (JP)

(73) Assignee: Japan Display Inc., Tokyo (JP)

(*) Notice: Subject to any disclaimer, the term of this patent is extended or adjusted under 35 U.S.C. 154(b) by 370 days.

(21) Appl. No.: 17/652,347

(22) Filed: Feb. 24, 2022

(65) Prior Publication Data

US 2022/0302095 A1    Sep. 22, 2022

(30) Foreign Application Priority Data

Mar. 17, 2021  (JP) ................... 2021-043955

(51) Int. Cl.
| | |
|---|---|
| H01L 25/16 | (2023.01) |
| H01L 23/00 | (2006.01) |
| H10D 86/01 | (2025.01) |
| H10D 86/40 | (2025.01) |
| H10D 86/60 | (2025.01) |

(52) U.S. Cl.
CPC ............ *H01L 25/167* (2013.01); *H01L 24/81* (2013.01); *H10D 86/021* (2025.01); *H10D 86/441* (2025.01); *H10D 86/60* (2025.01); *H01L 24/05* (2013.01); *H01L 24/13* (2013.01); *H01L 24/16* (2013.01); *H01L 2224/05111* (2013.01); *H01L 2224/13144* (2013.01); *H01L 2224/16145* (2013.01); *H01L 2224/16502* (2013.01); *H01L 2224/81007* (2013.01); *H01L 2224/81224* (2013.01); *H01L 2224/81805* (2013.01); *H01L 2924/1033* (2013.01); *H01L 2924/12041* (2013.01); *H01L 2924/143* (2013.01); *H01L 2924/404* (2013.01); *H01L 2924/40503* (2013.01)

(58) Field of Classification Search
CPC ............................ H10D 86/021; H10D 86/60
See application file for complete search history.

(56) References Cited

U.S. PATENT DOCUMENTS

2018/0031974 A1    2/2018  Prevatte et al.
2019/0312015 A1   10/2019  Lau et al.

FOREIGN PATENT DOCUMENTS

KR      1020200131910 A    11/2020
WO         2020026692 A1    2/2020

OTHER PUBLICATIONS

Machine-generated English translation of WO 2020/026692 (Year: 2020).*
Office Action issued on Aug. 6, 2024, in corresponding Japanese Application No. 2021-043955, 6 pages.

* cited by examiner

*Primary Examiner* — Bo B Jang
(74) *Attorney, Agent, or Firm* — Maier & Maier, PLLC

(57) ABSTRACT

A display device includes a drive circuit on an insulating substrate; a connecting electrode electrically connected to the drive circuit; an LED element electrically connected to the drive circuit via the connecting electrode, and a first light reflecting layer overlapping the LED element and having an inclined surface. The inclined surface reflects light incident on the inclined surface through the LED element toward the connecting electrode. The first light reflecting layer may have a reflectance of 90 percent or more for light at a wavelength of 1.0 μm or more to 1.5 μm or less.

7 Claims, 15 Drawing Sheets

DISPLAY DEVICE AND METHOD FOR MANUFACTURING THE SAME

CROSS REFERENCE TO RELATED APPLICATIONS

This application is based on and claims the benefit of priority from the prior Japanese Patent Application No. 2021-043955, filed on Mar. 17, 2021, the entire contents of which are incorporated herein by reference.

FIELD

One embodiment of the present invention relates to a display device and a method for manufacturing the same. In particular, the present invention relates to a display device with an LED (Light Emitting Diode) element and a method for manufacturing the same.

BACKGROUND

Recently, an LED display in which a minute LED element is mounted on each pixel is being developed as a next-generation display device. Normally, an LED display has a structure in which a plurality of LED elements is mounted on a circuit substrate constituting a pixel array. The circuit substrate has a drive circuit for emitting an LED at a position corresponding to each pixel. These drive circuits are electrically connected to each LED, respectively.

The aforementioned drive circuit and LED are electrically connected via a connecting electrode. Specifically, an electrode pad provided on the drive circuit side and an electrode pad provided on the LED element side are electrically connected to each other. For example, U.S. Patent Application Publication No. 2018/0031974 discloses a technique for bonding an LED element and a circuit substrate using an adhesive layer.

SUMMARY

A display device according to an embodiment of the present invention includes a drive circuit on an insulating substrate; a connecting electrode electrically connected to the drive circuit; an LED element electrically connected to the drive circuit via the connecting electrode, and a first light-reflecting layer overlapping the LED element and having an inclined surface.

A method for manufacturing a display device according to an embodiment of the present invention includes forming a drive circuit to drive an LED element on an insulating substrate; forming a connecting electrode electrically connected to the drive circuit and a first light-reflecting layer having an inclined surface on the drive circuit; arranging the LED element so that the connecting electrode is in contact with a terminal electrode of the LED element; and bonding the connecting electrode and the terminal electrode by irradiating laser light through a semiconductor layer of the LED element to the first light-reflecting layer.

DESCRIPTION OF EMBODIMENTS

Figure 1:
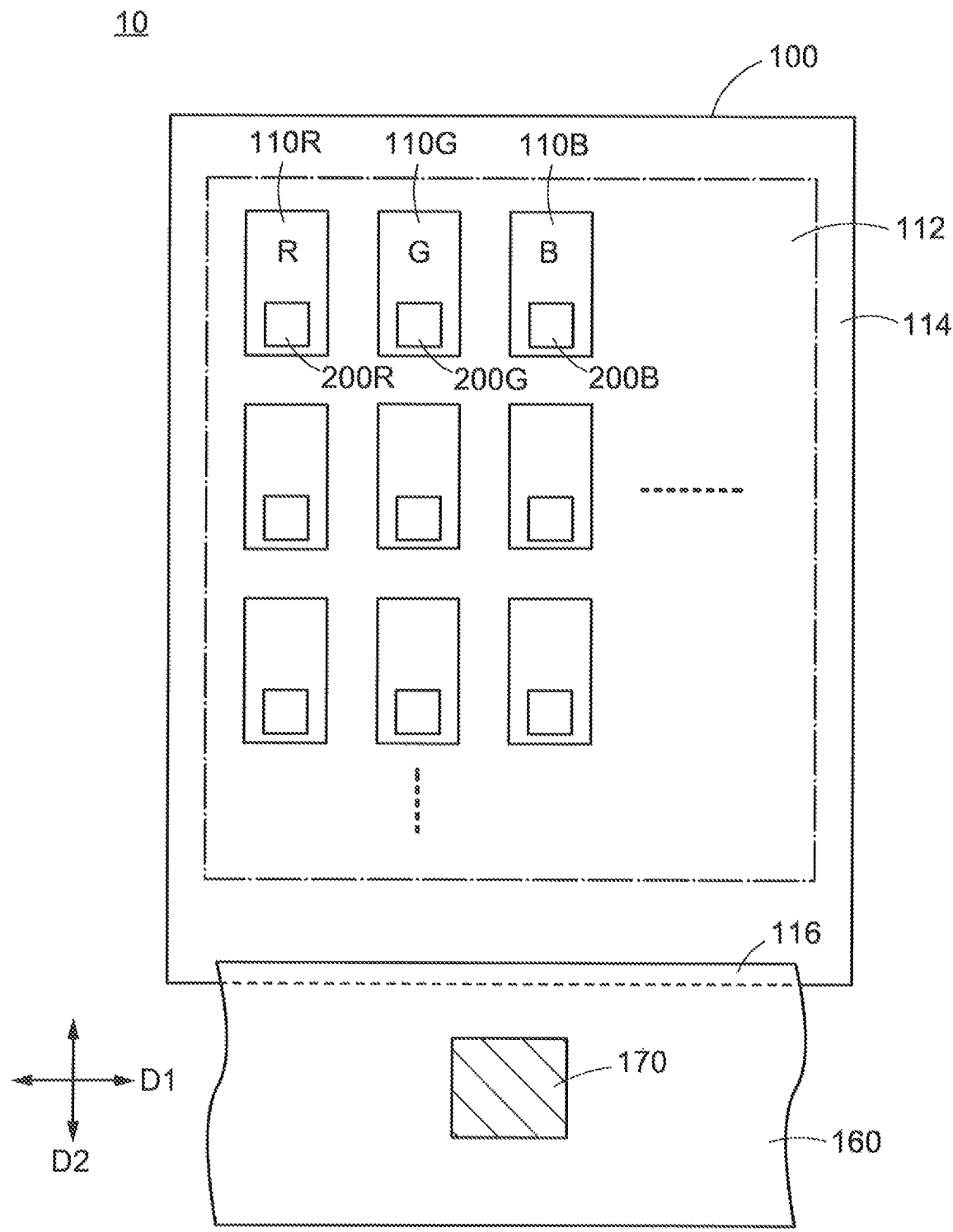
FIG. 1 is a plan view of a schematic configuration of a display device according to a first embodiment of the present invention.

In the above-mentioned prior art, since an LED element and a circuit substrate are bonded to each other with an adhesive layer interposed therebetween, there is a possibility that the LED element may be detached by strong vibrations. Also, in a final product manufactured by the above-mentioned prior art, the adhesive layer remains between the circuit substrate and the LED. Since the adhesive layer is provided on the entire surface of the circuit substrate, there is a possibility that a semiconductor element constituting the circuit is contaminated by alkaline components contained in organic substances and the like constituting the adhesive layer, thereby causing operation failure.

One object of the present invention is to firmly bond the LED element to the circuit substrate by a simple method.

Embodiments of the present invention will be described below with reference to the drawings and the like. However, the present invention can be implemented in various modes without departing from the gist thereof. The present invention is not to be construed as being limited to the description of the following exemplary embodiments. For the sake of clarity of description, the drawings may be schematically represented with respect to widths, thicknesses, shapes, and the like of the respective portions in comparison with actual modes. However, the drawings are merely examples and do not limit the interpretation of the present invention.

In describing the present embodiment, direction from a substrate to an LED element is "above" and the opposite direction is "below". However, the expression "above" or "below" merely describes the upper limit relationship of each element. For example, the expression that an LED element is arranged above a substrate also includes the presence of other members between the substrate and the LED element. Furthermore, the expression "above" or "below" includes not only the case where the elements overlap but also the case where they do not overlap in a plan view. The expression "directly above" or "directly below" refers to the case where the elements overlap in a plan view.

In this specification and claims, a plurality of elements formed by performing a processing such as an etch on a film may be described as elements having different functions or different roles, respectively. The plurality of elements is composed of the same layer structure and the same material and are described as elements in the same layer. In the case where the plurality of elements formed by different processes is provided on the same other element and in contact with the other element, the plurality of elements is also described as elements in the same layer.

In this specification, the expressions "a includes A, B, or C", "a includes any of A, B, and C", and "a includes one selected from a group consisting of A, B, and C" do not exclude the case where a includes multiple combinations of A to C unless otherwise specified. Furthermore, these expressions do not exclude the case where a includes other elements.

In the description of the embodiment of the present invention, elements having the same functions as those of the elements already described are denoted by the same symbols or the same symbols with symbols such as alphabets, and the description thereof may be omitted. For example, in the case where there is a plurality of elements to which a certain symbol is attached in the drawings, the elements may be distinguished by attaching "a", "b" and the like to the symbols. On the other hand, in the case where it is not necessary to distinguish each element, only the symbol indicating the element will be used. Similarly, in the case where an element needs to be described separately for each color of RGB, it may be distinguished by the symbols R, G, or B after the symbols indicating the element. On the other hand, in the case where the elements need not be described separately for each color of RGB, only a symbol indicating the elements will be used.

First Embodiment

[Configuration of Display Device]

A configuration of a display device 10 according to one embodiment of the present invention will be described with reference to FIG. 1 to FIG. 4.

FIG. 1 is a plan view showing a schematic configuration of the display device 10 according to a first embodiment of the present invention. As shown in FIG. 1, the display device 10 includes a circuit substrate 100, a flexible printed circuit board 160 (FPC 160), and an IC element 170. The display device 10 is divided into a display area 112, a peripheral area 114, and a terminal area 116. The circuit substrate 100 is sometimes referred to as a TFT substrate, a backplane substrate, an array substrate, or the like.

The display area 112 is an area in which a plurality of pixels 110 including an LED element 200 is arranged in row direction (D1 direction) and column direction (D2 direction). Specifically, in the present embodiment, a pixel 110R including an LED element 200R, a pixel 110G including an LED element 200G, and a pixel 110B including an LED element 200B are arranged. The display area 112 functions as an area for displaying an image corresponding to a video signal.

The peripheral area 114 is an area around the display area 112. The peripheral area 114 is an area provided with driver circuits (a data driver circuit 130 and a gate driver circuit 140 shown in FIG. 2) for controlling pixel circuits (pixel circuits 120R, 120G, and 120B shown in FIG. 2) provided in each pixel 110.

The terminal area 116 is an area in which a plurality of wirings connected to the aforementioned driver circuits is aggregated. The flexible printed circuit board 160 is electrically connected to a plurality of wirings in the terminal area 116. A video signal (data signal) or control signal output from an external device (not shown) is input to the IC element 170 via the wiring (not shown) provided in the flexible printed circuit board 160. The IC element 170 performs various signal processing on the video signal and generates a control signal required for display control. The video signal and control signal output from the IC element 170 are input to the display device 10 via the flexible printed circuit board 160.

[Circuit Configuration of Display Device]

Figure 2:
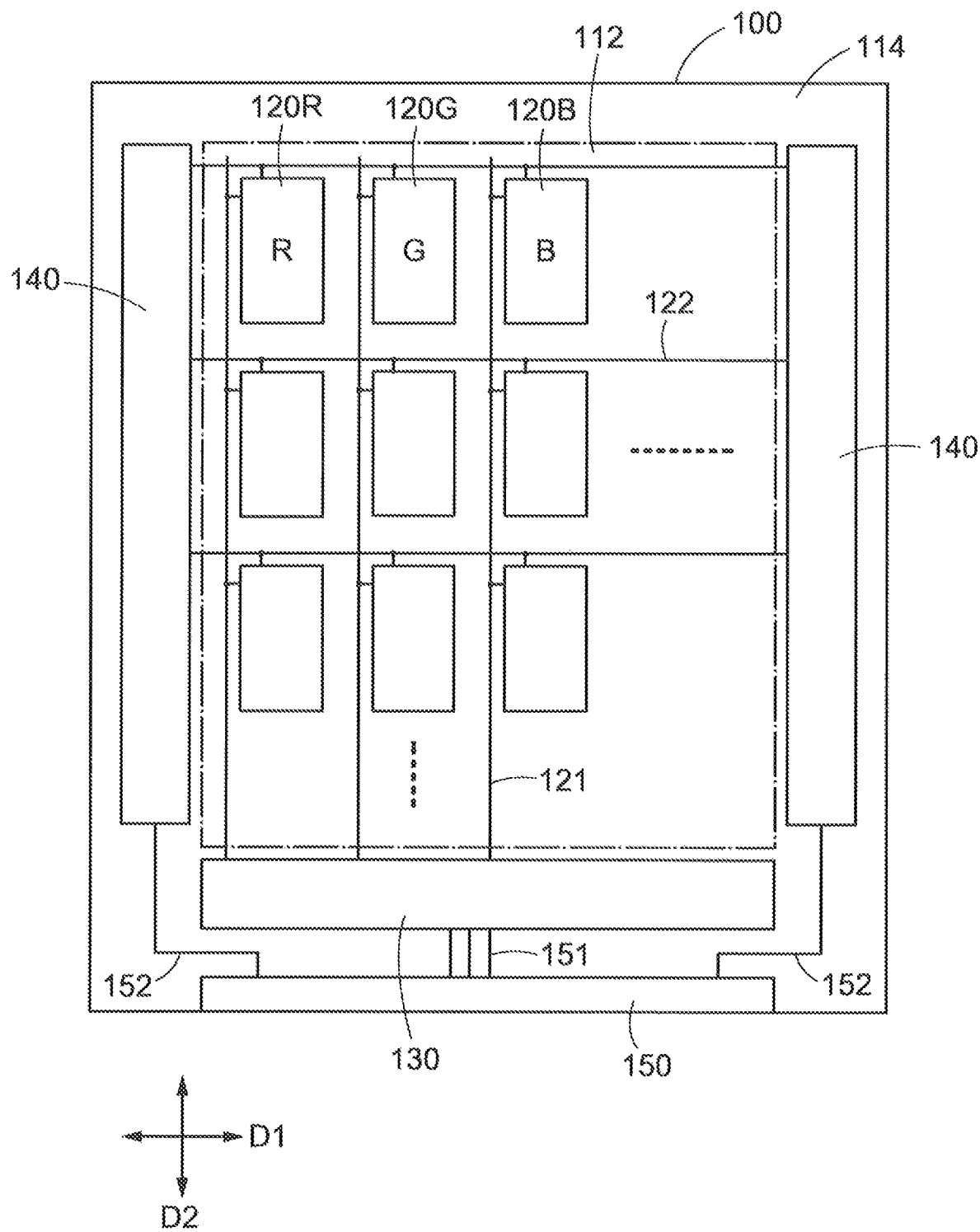
FIG. 2 is a block diagram of a circuit configuration of the display device according to the first embodiment of the present invention.

FIG. 2 is a block diagram showing a circuit configuration of the display device 10 according to the first embodiment of the present invention. As shown in FIG. 2, the display area 112 is provided with the pixel circuit 120 corresponding to each pixel 110. In the present embodiment, the pixel circuit 120R, the pixel circuit 120G, and the pixel circuit 120B are provided corresponding to the pixel 110R, the pixel 110G, and the pixel 110B, respectively. That is, a plurality of pixel circuits 120 is arranged in the row direction (D1 direction) and the column direction (D2 direction) in the display area 112.

Figure 3:
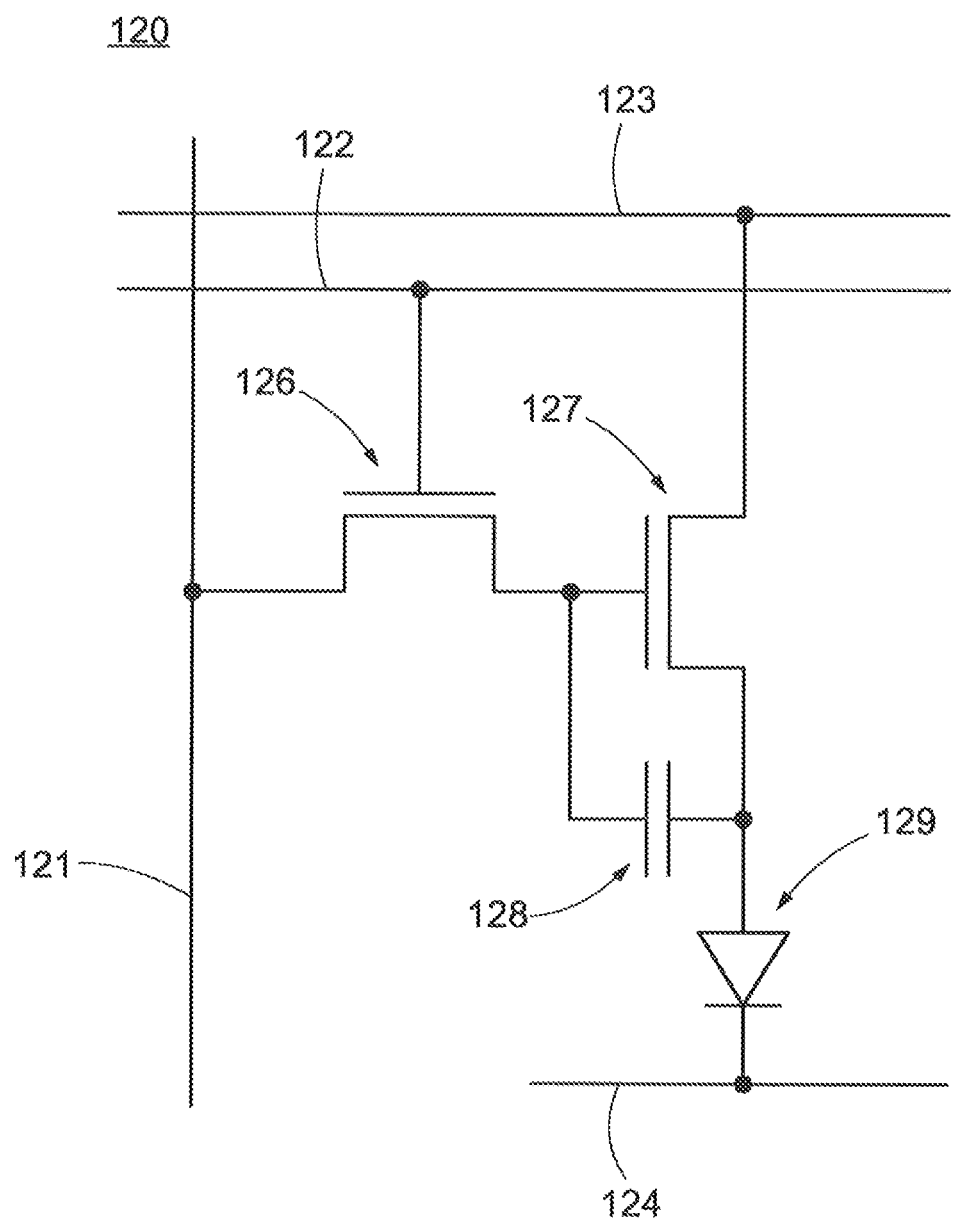
FIG. 3 is a circuit diagram of a configuration of a pixel circuit of the display device according to the first embodiment of the present invention.

FIG. 3 is a circuit diagram showing a configuration of the pixel circuit 120 of the display device 10 according to the first embodiment of the present invention. The pixel circuit 120 is arranged in an area surrounded by a data line 121, a gate line 122, an anode power line 123, and a cathode power line 124. The pixel circuit 120 of the present embodiment includes a select transistor 126, a drive transistor 127, a storage capacity 128, and an LED 129. The LED 129 corresponds to the LED element 200 shown in FIG. 1. Of the pixel circuit 120, circuit elements other than the LED 129 correspond to a drive circuit 125 provided in the circuit substrate 100 (see FIG. 4). That is, the pixel circuit 120 is completed with the LED element 200 mounted on the circuit substrate 100.

As shown in FIG. 3, a source electrode, gate electrode, and drain electrode of the select transistor 126 are connected to the data line 121, the gate line 122, and a gate electrode of the drive transistor 127, respectively. The source electrode, gate electrode, and drain electrode of the drive transistor 127 are connected to the anode power line 123, a drain electrode of the select transistor 126, and the LED 129, respectively. The storage capacity 128 is connected between the gate electrode and the drain electrode of the drive transistor 127. That is, the storage capacity 128 is connected to the drain electrode of the select transistor 126. The anode and cathode of the LED 129 are connected to the drain electrode of the drive transistor 127 and the cathode power line 124, respectively.

A gradation signal for determining an emission intensity of the LED 129 is supplied to the data line 121. A gate signal for selecting the select transistor 126 that writes the gradation signal is supplied to the gate line 122. When the select transistor 126 is turned on, the gradation signal is stored in the storage capacity 128. Thereafter, when the drive transistor 127 is turned on, a drive current corresponding to the gradation signal flows through the drive transistor 127. When the drive current output from the drive transistor 127 is input to the LED 129, the LED 129 emits light with a light emission intensity corresponding to the gradation signal.

Referring to FIG. 2 again, a data driver circuit 130 is arranged at a position adjacent to the display area 112 in the column direction (D2 direction). A gate driver circuit 140 is arranged at a position adjacent to the display area 112 in the row direction (D1 direction). In the present embodiment, although two gate driver circuits 140 are provided on both sides of the display area 112, it may be only one of them.

Both the data driver circuit 130 and the gate driver circuit 140 are arranged in the peripheral area 114. However, the area where the data driver circuit 130 is arranged is not limited to the peripheral area 114. For example, the data driver circuit 130 may be arranged on the flexible printed circuit board 160.

The data line 121 shown in FIG. 3 extends from the data driver circuit 130 toward the column direction and is connected to the source electrode of the select transistor 126 in each pixel circuit 120. The gate line 122 extends from the gate driver circuit 140 toward the row direction and is connected to the gate electrode of the select transistor 126 in each pixel circuit 120.

A terminal portion 150 is arranged in the terminal area 116. The terminal portion 150 is connected to the data driver circuit 130 via a connecting wiring 151. Similarly, the terminal portion 150 is connected to the gate driver circuit 140 via a connecting wiring 152. In addition, the terminal portion 150 is connected to the flexible printed circuit board 160.

[Cross-Sectional Structure of Pixel]

Figure 4:
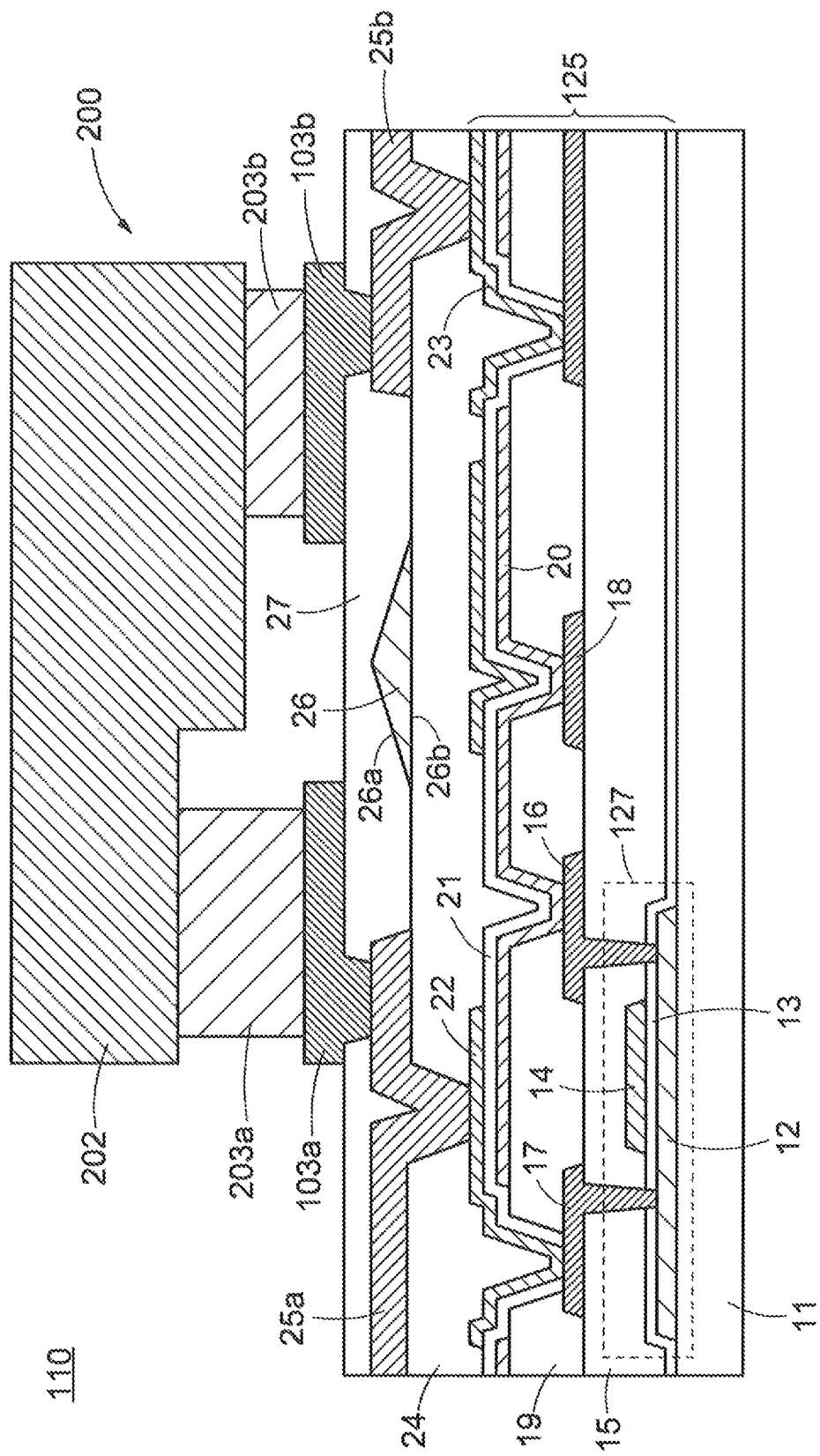
FIG. 4 is a cross-sectional view of a configuration of a pixel of the display device according to the first embodiment of the present invention.

FIG. 4 is a cross-sectional view showing a configuration of the pixel 110 of the display device 10 according to the first embodiment of the present invention. The pixel 110 includes the drive transistor 127 provided on an insulating substrate 11. A glass substrate, a resin substrate, a ceramic substrate or a substrate in which an insulating layer is provided on a metal substrate can be used as the insulating substrate 11. In the case where the resin substrate is used as the insulating substrate 11, flexibility can be applied to the display device 10.

The drive transistor 127 includes a semiconductor layer 12, a gate insulating layer 13, and a gate electrode 14. A source electrode 16 and a drain electrode 17 are connected to the semiconductor layer 12 via an insulating layer 15. Although not shown, the gate electrode 14 is connected to a drain electrode of the select transistor 126 shown in FIG. 3.

A wiring 18 is provided in the same layer as the source electrode 16 and the drain electrode 17. The wiring 18 functions as the anode power line 123 shown in FIG. 3. Therefore, the source electrode 16 and the wiring 18 are electrically connected by a connecting wiring 20 provided on a planarization layer 19. The planarization layer 19 is a transparent resin layer using a resinous material such as polyimide or acrylic. The connecting wiring 20 is a transparent conductive layer using a metal oxide material such as ITO. However, the present invention is not limited to this example, and other metal materials may be used as the connecting wiring 20.

An insulating layer 21 made of silicon nitride or the like is provided on the connecting wiring 20. An anode electrode 22 and a cathode electrode 23 are provided on the insulating layer 21. The anode electrode 22 and the cathode electrode 23 are made of a metal material. The anode electrode 22 is connected to the drain electrode 17 via an opening provided in the planarization layer 19 and the insulating layer 21. When the anode electrode 22 and the cathode electrode 23 are formed, the drive circuit 125 is completed. Although not shown in FIG. 4, in addition to the drive transistor 127, the select transistor 126 and the storage capacity 128 are formed.

The anode electrode 22 and the cathode electrode 23 are connected to mounting pads 25a and 25b, respectively, via an insulating layer 24 which functions as a planarization layer. The mounting pad 25a functions as an intermediate layer for electrically connecting the drive transistor 127 and the LED element 200. The mounting pad 25b functions as an intermediate layer for electrically connecting the LED element 200 and the cathode electrode 23.

In the present embodiment, a light-reflecting layer 26 is formed in the same layer as the mounting pads 25a and 25b. The light-reflecting layer 26 functions as a layer for reflecting laser light emitted from above in an oblique direction. As will be described later, the laser light transmitted through a semiconductor layer 202 of the LED element 200 is reflected toward connecting electrodes 103a and 103b by the light-reflecting layer 26. The laser light reflected by the light-reflecting layer 26 is utilized for melt bonding of the connecting electrode 103 and a terminal electrode 203.

The light-reflecting layer 26 is preferably made of a material that exhibits a relatively high reflectance at the wavelength of light transmitted through the semiconductor layer 202 of the LED element 200. In the present embodiment, since a semiconductor material containing gallium nitride which transmits near-infrared light is used as the semiconductor layer 202, light emitted from a YAG laser or YVO$_4$ laser (wavelength: about 1064 nm) is used as the laser light. Therefore, the light-reflecting layer 26 desirably has a light reflectance of 90% or more (preferably 95% or more) at a wavelength of 1.0 μm or more and 1.5 μm or less. A metal material including gold, silver, copper, or aluminum (including an alloy material) can be used as such a material. A metal layer using these materials may be a single layer, or two or more kinds of metal layers may be stacked.

In the present embodiment, the mounting pads 25a and 25b and the light-reflecting layer 26 are formed by different processes. Specifically, the mounting pads 25a and 25b are formed using a metal material including tantalum, tungsten, molybdenum, titanium, or aluminum. On the other hand, the light-reflecting layer 26 of the present embodiment is formed using a metal material including gold, silver, copper, or aluminum. An example in which copper is used as a material forming the light-reflecting layer 26 will be described.

As shown in FIG. 4, the light-reflecting layer 26 is arranged directly below the semiconductor layer 202 of the LED element 200. Specifically, the light-reflecting layer 26 is arranged between the connecting electrode 103a and the connecting electrode 103b. In this case, in a plan view, a part of the light-reflecting layer 26 preferably overlaps the connecting electrode 103a and the connecting electrode 103b. By overlapping a part of the light-reflecting layer 26 and the connecting electrode 103, it is possible to suppress the quantity of laser light reaching below the light-reflecting layer 26 (i.e., the drive circuit 125). However, the present invention is not limited to this example, and the light-reflecting layer 26 may not overlap with the connecting electrode 103.

As shown in FIG. 4, the light-reflecting layer 26 of the present embodiment has an inclined surface 26a. The inclined surface 26a is a surface having a predetermined gradient with respect to a lower surface 26b when the lower surface 26b in contact with the insulating layer 24 is used as a reference. The gradient of the inclined surface 26a is set so that the laser light transmitted through the LED element 200 and incident on the inclined surface 26a is reflected toward the connecting electrode 103.

Figure 5:
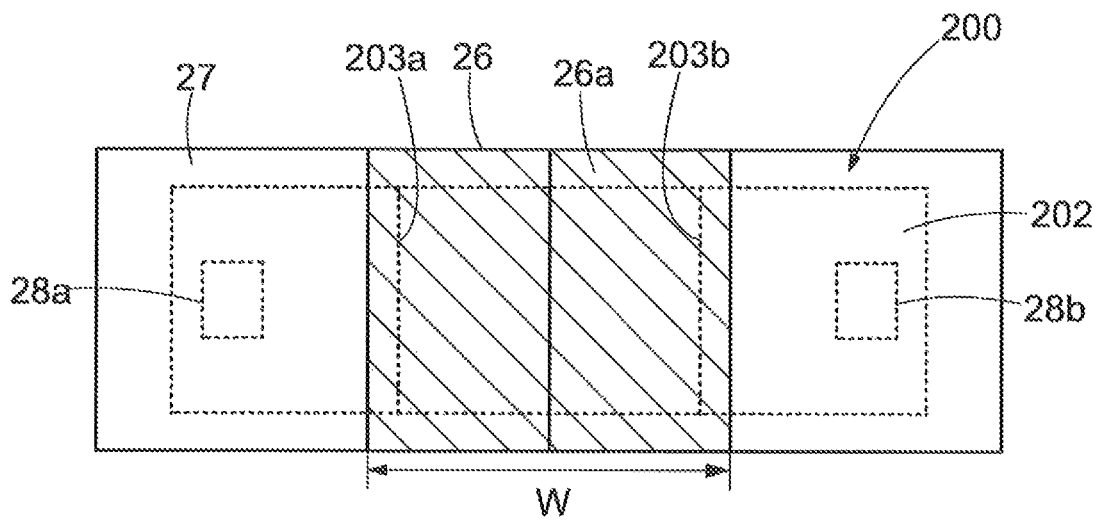
FIG. 5 is an enlarged plan view of a vicinity of an LED element in a pixel of the first embodiment of the present invention.
Figure 6:
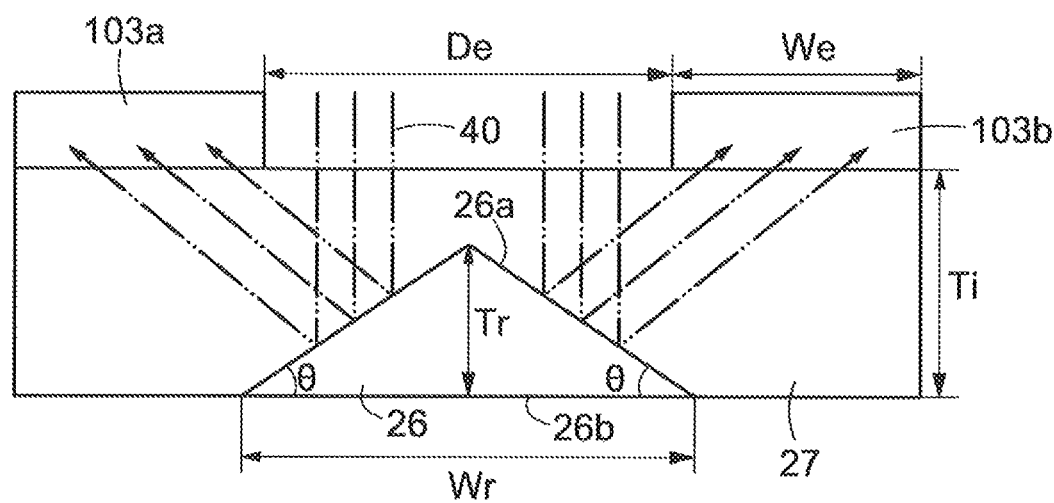
FIG. 6 is cross-sectional view schematically showing a vicinity of an LED element in a pixel of the first embodiment of the present invention.

FIG. 5 is an enlarged plan view of a vicinity of the LED element 200 in the pixel 110 of the first embodiment of the present invention. FIG. 6 is a cross-sectional view schematically showing a vicinity of the LED element 200 in the pixel 110 of the first embodiment of the present invention. In FIG. 5 and FIG. 6, the same elements as those in FIG. 4 are denoted by the same symbols, and a description thereof is omitted.

As shown in FIG. 5, the light-reflecting layer 26 is arranged so as to cover an area between the connecting electrode 103a and the connecting electrode 103b (hereinafter referred to as "reflection area") among an area directly below the LED element 200. In the present embodiment, an example in which the size of the light-reflecting layer 26 in a plan view (strictly speaking, the size of the lower surface 26b of the light-reflecting layer 26) is larger than the size of the reflection area is shown. However, the present invention is not limited to this example, the size of the light-reflecting layer 26 in a plan view may be the same as the size of the reflection area or may be smaller than the size of the reflection area.

FIG. 6 schematically shows an optical path of the laser light 40 in the case of performing laser irradiation to be described later. Although not shown, the laser light 40 is transmitted through the semiconductor layer 202 of the LED element 200 arranged directly above the light-reflecting layer 26 and is incident on the light-reflecting layer 26. As shown in FIG. 6, the laser light 40 is reflected by the inclined surface 26a of the light-reflecting layer 26, toward the connecting electrode 103.

In FIG. 6, a gradient (θ) of the inclined surface 26a is determined in consideration of, for example, a thickness (Tr) of the light-reflecting layer 26, a width (W) of the light-reflecting layer 26, a thickness (Ti) of an insulating layer 27, a distance (De) between the connecting electrode 103, and a width (We) of the connecting electrode 103 and the like. As shown in FIG. 6, the width (Wr) of the light-reflecting layer 26 corresponds to the length of the lower surface 26b in a cross-sectional view where the light-reflecting layer 26 is cut so that the inclined surface 26a facing the connecting electrode 103a and the connecting electrode 103b appears in the cross section.

In the present embodiment, the inclined surface 26a of the light-reflecting layer 26 may be set so that at least a part of the laser light 40 is incident on the connecting electrode 103. For example, in the case where the width (Wr) of the light-reflecting layer 26 is 10 μm and the film thickness (Ti) of the insulating layer 27 is 4 μm or 5 μm, the film thickness (Tr) of the light-reflecting layer 26 is within a range of 3 μm or more and 4 μm or less, and the gradient of the inclined surface 26a is within a range of 30 degrees or more and 40 degrees or less. However, these numerical ranges are merely examples, and the amount of the laser light 40 incident on the connecting electrode 103 can be appropriately adjusted by adjusting the above-mentioned parameters.

Referring back to FIG. 4, the insulating layer 27 is provided on the mounting pad 25 and the light-reflecting layer 26. The insulating layer 27 has a function of insulating the connecting electrode 103 and the light-reflecting layer 26. Since the insulating layer 27 needs to transmit the laser light (particularly, infrared light) irradiated to the light-reflecting layer 26, a material having high transmittance of infrared light is desirable. In the present embodiment, an inorganic insulating material made of aluminum oxide (including sapphire), silicon nitride, or silicon oxide is used as the insulating layer 27.

The insulating layer 27 may function as a planarization layer to release an unevenness caused by the mounting pad 25 and the light-reflecting layer 26. In this case, the insulating layer 27 preferably has a thickness sufficiently thicker than the thicknesses of the mounting pad 25 and the light-reflection layer 26.

The connecting electrode 103a and the connecting electrode 103b are provided on the insulating layer 27. The connecting electrodes 103a and 103b are connected to the mounting pads 25a and 25b, respectively, via openings provided in the insulating layer 27. In the present embodiment, an electrode made of tin (Sn) is arranged as the connecting electrode 103.

The LED element 200 is arranged above the connecting electrodes 103a and 103b. The LED element 200 includes the semiconductor layer 202, a terminal electrode 203a, and a terminal electrode 203b. The semiconductor layer 202 functions as a photoelectric conversion layer including an n-type semiconductor layer and p-type semiconductor layer. In the present embodiment, although the semiconductor layer 202 is configured using a semiconductive material containing gallium nitride, it is not limited to this example.

In the present embodiment, as shown in FIG. 3, the anode of the LED element 200 is connected to the drive transistor 127. Therefore, the terminal electrode 203a is connected to the p-type semiconductor layer of the semiconductor layer 202 and to the connecting electrode 103a. The terminal electrode 203b is connected to the n-type semiconductor layer of the semiconductor layer 202 and is connected to the connecting electrode 103b.

In the present embodiment, the terminal electrode 203 is an electrode made of gold (Au). As will be described later, the connecting electrode 103 and the terminal electrode 203 are bonded by melt bonding by laser light irradiation. Therefore, there is an alloy layer (eutectic alloy containing tin and gold) (not shown) between the connecting electrode 103 and the terminal electrode 203.

The LED element 200 corresponds to the LED 129 in the circuit diagram shown in FIG. 3. Specifically, the terminal electrode 203a of the LED element 200 is connected to the anode electrode 22 connected to the drain electrode 17 of the drive transistor 127. The terminal electrode 203b of the LED element 200 is connected to the cathode electrode 23. The cathode electrode 23 is electrically connected to the cathode power line 124 shown in FIG. 3.

Since the LED element 200 is firmly mounted by melt bonding by infrared light radiation, the display device 10 of the present embodiment having the above structure has the advantage of high resistance to impact and the like.

[Manufacturing Method of Display Device]

Figure 7:
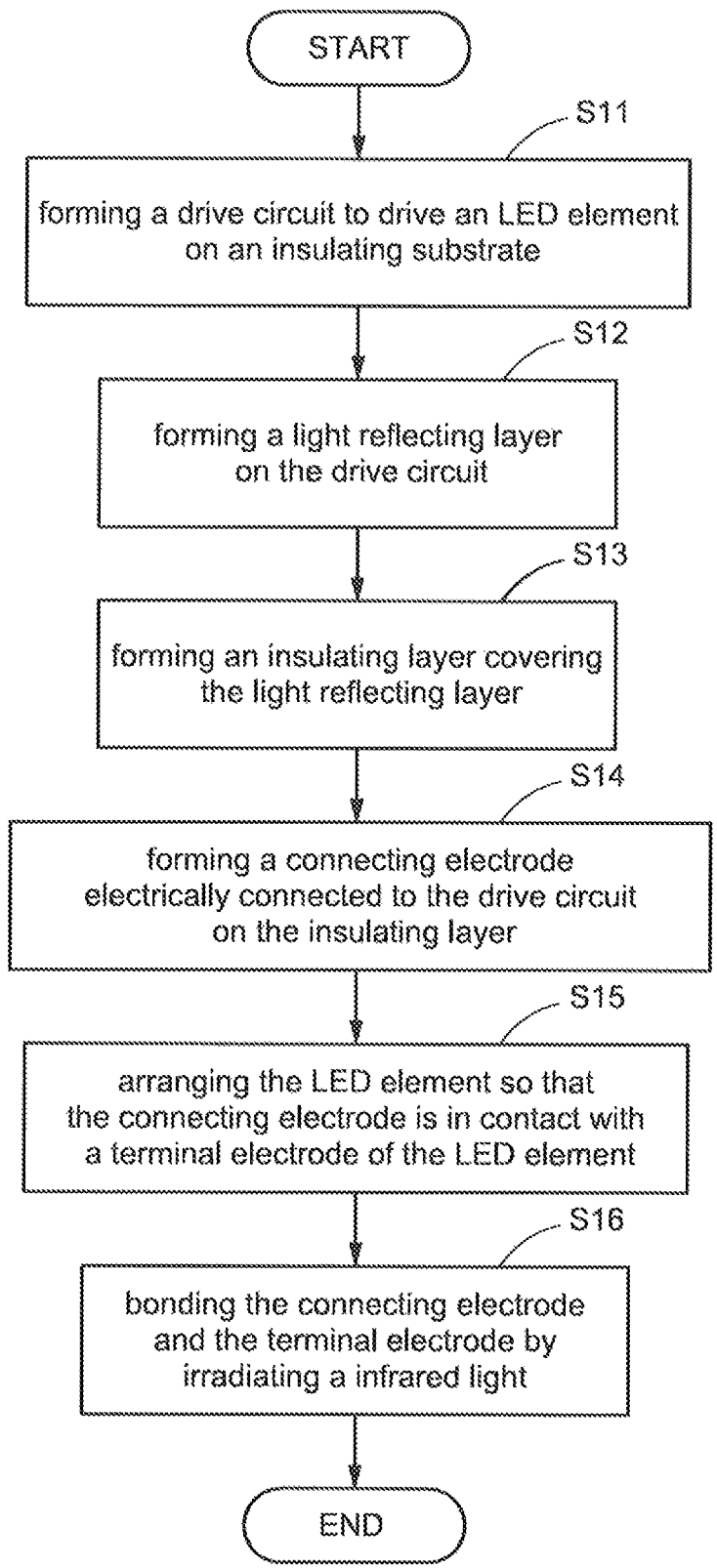
FIG. 7 is a flowchart diagram of a manufacturing method of the display device according to the first embodiment of the present invention.

FIG. 7 is a flowchart diagram showing a manufacturing method of the display device 10 according to the first embodiment of the present invention. FIG. 8 to FIG. 13 are cross-sectional views showing a manufacturing method of the display device 10 according to the first embodiment of the present invention. Hereinafter, a manufacturing method of the display device 10 will be described with reference to FIG. 7. At that time, a cross-sectional structure in each manufacturing process will be described with reference to FIG. 8 to FIG. 13.

Figure 8:
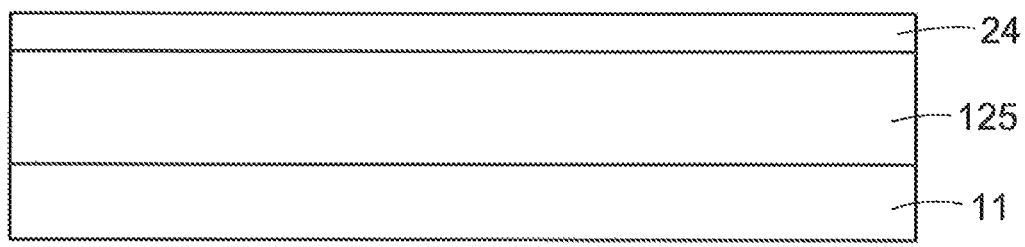
FIG. 8 is a cross-sectional view of a manufacturing process of the display device according to the first embodiment of the present invention.

First, in step S11 of FIG. 7, the drive circuit 125 for driving the LED element 200 is formed on the insulating substrate 11. FIG. 8 shows a cross-sectional structure corresponding to step S11 of FIG. 7. For example, a glass substrate, a resin substrate, a ceramic substrate, or a metal substrate can be used as the insulating substrate 11. Although not shown in FIG. 8, the drive circuit 125 of the present embodiment includes the select transistor 126 and the storage capacity 128 in addition to the drive transistor 127. However, the configuration of the drive circuit 125 is not limited to this example and may include other circuit elements as required.

Since the drive circuit 125 can be formed using a normal thin film forming technique, the description of the specific manufacturing process of the drive circuit 125 will be omitted. After the drive circuit 125 is formed on the insulating substrate 11, the insulating layer 24 is formed to planarize undulations caused by the drive circuit 125.

Figure 9:
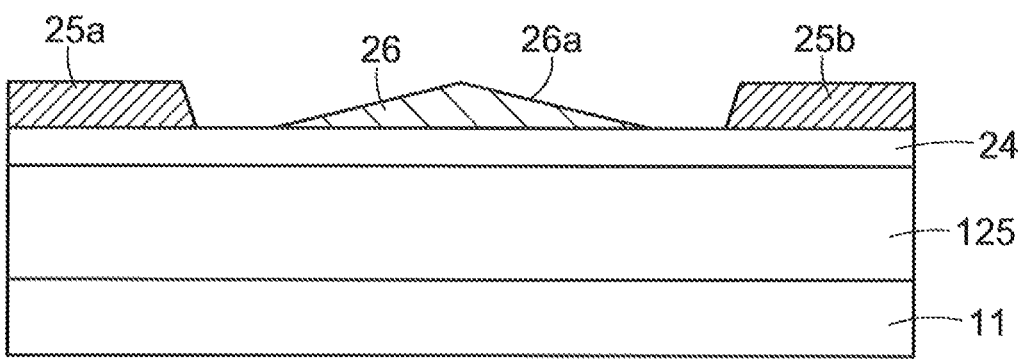
FIG. 9 is a cross-sectional view of a manufacturing process of the display device according to the first embodiment of the present invention.

Next, in step S12 of FIG. 7, the light-reflecting layer 26 is formed on the drive circuit 125 (specifically, on the insulating layer 24 covering the drive circuit 125). FIG. 9 shows a cross-sectional structure corresponding to step S12 of FIG. 7. In the present embodiment, a metal layer containing copper is formed by a sputtering method or an electroless plating method and patterned by photolithography to form the light-reflecting layer 26. The inclined surface 26a of the light-reflecting layer 26 may be formed by utilizing the recession of a resist mask when etching the metal layer containing copper.

After the light-reflecting layer 26 is formed, the mounting pad 25a and the mounting pad 25b are further formed on the insulating layer 24. Although not shown, the mounting pads 25a and 25b are connected to the anode electrode 22 and the cathode electrode 23, respectively, as shown in FIG. 4.

Therefore, openings (not shown) are formed in the insulating layer 24 before forming the mounting pads 25a and 25b. In the present embodiment, although a metal material containing tantalum is used as a constituent material of the mounting pad 25, the present invention is not limited to this example. The mounting pad 25 can be formed by, for example, a sputtering method.

Figure 10:
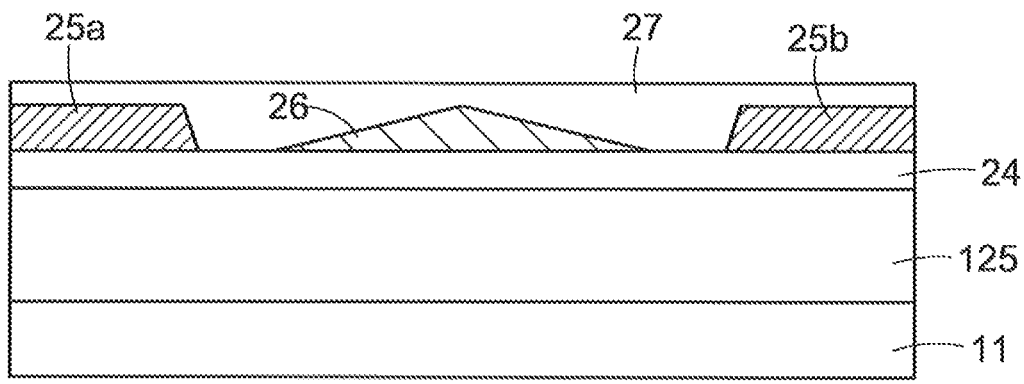
FIG. 10 is a cross-sectional view of a manufacturing process of the display device according to the first embodiment of the present invention.

Next, in step S13 of FIG. 7, the insulating layer 27 covering the light-reflecting layer 26 and the mounting pad 25 is formed. FIG. 10 shows a cross-sectional structure corresponding to step S13 of FIG. 7. The insulating layer 27 is a layer for insulating the connecting electrode 103 and the light-reflection layer 26 to be formed later. In the present embodiment, an insulating layer made of silicon oxide is used as the insulating layer 27.

Figure 11:
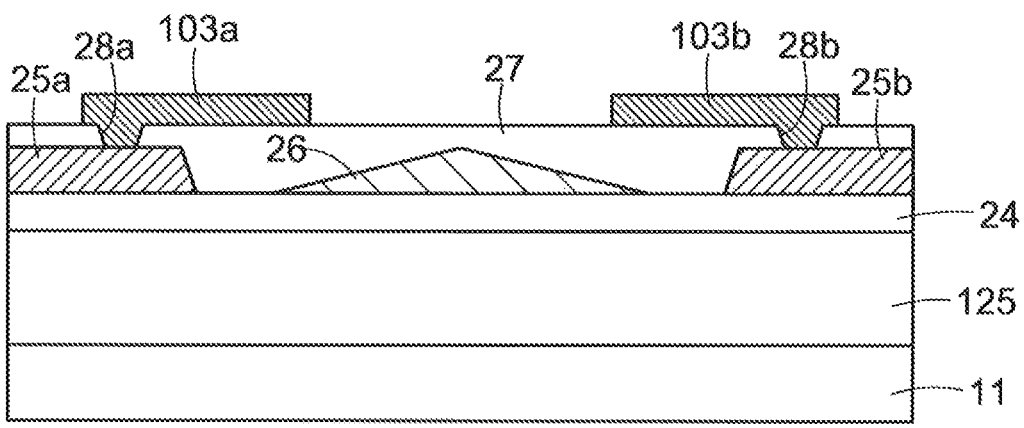
FIG. 11 is a cross-sectional view of a manufacturing process of the display device according to the first embodiment of the present invention.

Next, in S14 of FIG. 7, the connecting electrode 103a and the connecting electrode 103b electrically connected to the drive circuit 125 are formed on the insulating layer 27. FIG. 11 shows a cross-sectional structure corresponding to step S14 of FIG. 7. In the present embodiment, tin (Sn) is used as a constituent material of the connecting electrode 103. However, the present invention is not limited to this example, and other metal materials capable of forming a eutectic alloy between the terminal electrode 203 of the LED element 200 to be described later may be used. For example, both the connecting electrode 103 and the terminal electrode 203 may be made of tin (Sn). A thickness of the connecting electrode 103 may be 0.2 µm or more and 5 µm or less (preferably 1 µm or more and 3 µm or less).

The connecting electrodes 103a and 103b are formed to match the position of the mounting pads 25a and 25b, respectively. Specifically, after the insulating layer 27 is formed in step S13 of FIG. 7, an opening 28a and an opening 28b are formed on the insulating layer 27 at a position corresponding to the mounting pads 25a and 25b, respectively. Thereafter, the connecting electrodes 103a and 103b that are electrically connected to the mounting pads 25a and 25b are formed on the insulating layer 27. In this case, each of the connecting electrodes 103a and 103b overlaps a part of the light-reflecting layer 26 in a plan view. With such a structure, it is possible to reduce the amount of laser light reaching below the light-reflecting layer 26 when the laser to be described later is irradiated.

Figure 12:
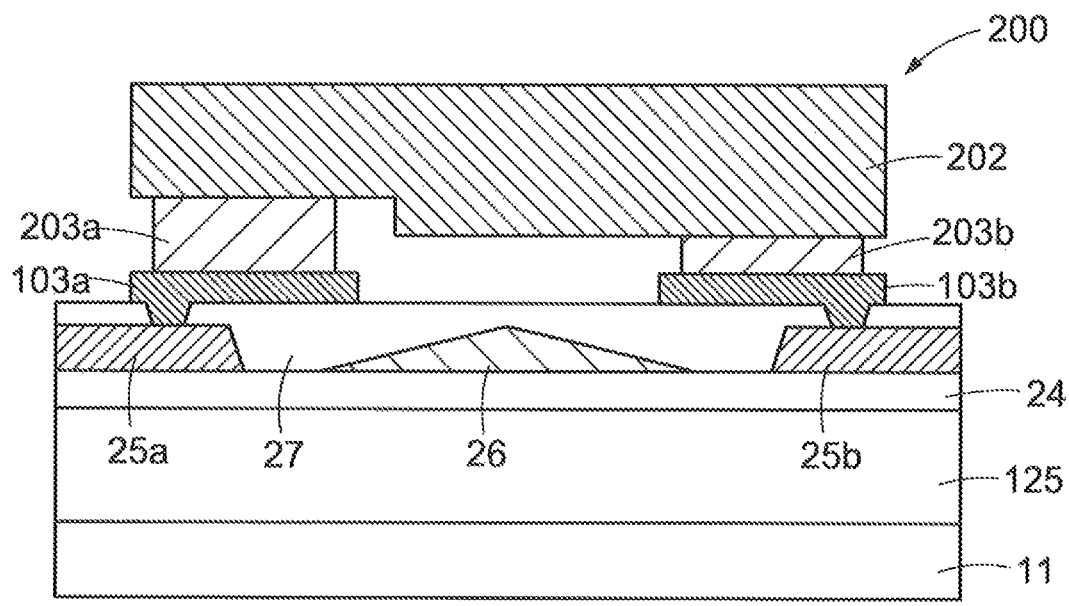
FIG. 12 is a cross-sectional view of a manufacturing process of the display device according to the first embodiment of the present invention.

Next, in S15 of FIG. 7, the LED element 200 is arranged so that the connecting electrodes 103a and 103b and the terminal electrodes 203a and 203b of the LED element 200 are in contact with each other. FIG. 12 shows a cross-sectional structure corresponding to step S15 of FIG. 7. In this case, the terminal electrode 203a is located above the connecting electrode 103a, and the terminal electrode 203b is located above the connecting electrode 103b. Although only one LED element 200 is shown in FIG. 12, in practice, the LED element 200 is arranged in each pixel. That is, a plurality of LED elements 200 is arranged on the circuit substrate on which the drive circuit 125 is formed.

The plurality of LED elements 200 may be collectively aligned with respect to the connecting electrode 103. For example, the plurality of LED elements 200 is formed on a semiconductor substrate such as a sapphire substrate to match the pixel pitch. Thereafter, the plurality of LED elements 200 and a plurality of terminal electrodes 203 provided in each pixel may be aligned collectively.

As shown in FIG. 12, in the present embodiment, an example of mounting a flip-element type LED element 200 having the two terminal electrodes 203a and 203b on the surface facing the drive circuit 125 will be described. However, the form of the LED element 200 is not limited to this example. For example, the LED element 200 may be constructed with an anode electrode (or cathode electrode) on a side closer to the drive circuit 125 and a cathode electrode (or anode electrode) on a side farther from the drive circuit 125. That is, the LED element 200 may be a face-up type LED element having a structure in which a light-emitting layer is sandwiched between the anode electrode and the cathode electrode. In the case where a face-up type LED element is used as the LED element 200, the connecting electrode 103 may be provided one for each pixel.

The LED element 200 shown in FIG. 12 includes the semiconductor layer 202 made of a semiconducting material containing gallium nitride grown on a semiconductor substrate (not shown). In the present embodiment, a sapphire substrate is used as the semiconductor substrate. However, combinations of a material constituting the semiconductor substrate and a material constituting the semiconductor layer 202 of the LED element 200 may be appropriately determined according to an emission color of the LED element 200.

Figure 13:
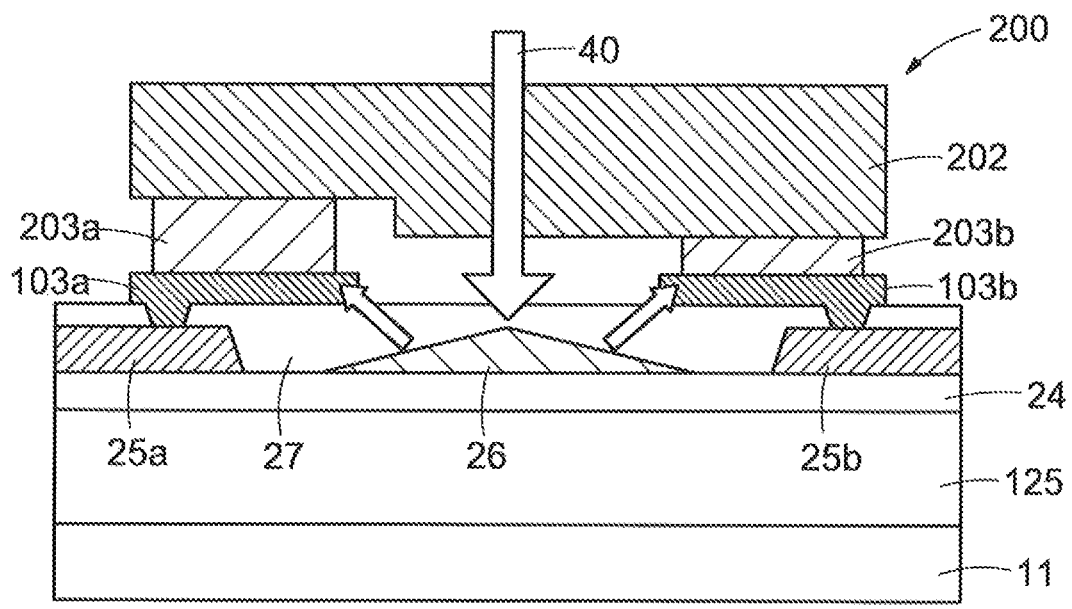
FIG. 13 is a cross-sectional view of a manufacturing process of the display device according to the first embodiment of the present invention.

Next, in step S16 of FIG. 7, the connecting electrode 103 and the terminal electrode 203 are bonded by irradiating the light-reflecting layer 26 with the laser light 40 via the semiconductor layer 202 of the LED element 200. FIG. 13 shows a cross-sectional structure corresponding to step S16 of FIG. 7. In the present embodiment, near-infrared light (wavelength: about 1064 nm) emitted from a YAG laser or YVO$_4$ laser is used as the laser light 40.

As shown in FIG. 13, the laser light 40 emitted from an external light source is transmitted through the semiconductor layer 202 of the LED element 200 and is irradiated to the light-reflecting layer 26. In the present embodiment, since the semiconductor layer 202 is a gallium nitride-based semiconductor material, it transmits near-infrared light. On the other hand, since a metal material containing copper having 95% or more of the reflectance to near-infrared light is used as the light-reflecting layer 26, the laser light 40 is reflected by the inclined surface 26a.

In the present embodiment, although an example of using near-infrared light is used as the laser light 40 is shown, the present invention is not limited to this example. The laser light 40 can be selected from laser lights having an appropriate wavelength according to the semiconductor layer 202 and the like constituting the semiconductor layer 202 of the LED element 200. For example, the laser light 40 may be infrared light with a wavelength longer than near-infrared light. The laser light 40 may be visible light with a wavelength shorter than near infrared light (e.g., green laser light). Regardless of which laser light is used, it is desirable to select the material of the light-reflecting layer 26 so that the laser light 40 can be efficiently reflected according to the wavelength of the laser light 40 to be used.

The laser light 40 reflected by the light-reflecting layer 26 is incident on the connecting electrode 103 via the insulating layer 27. The laser light 40 incident on the connecting electrode 103 is absorbed by the connecting electrode 103 and converted into heat. The heat generated by the connecting electrode 103 is further transferred to the terminal electrode 203 of the LED element 200. Therefore, the laser light 40 reflected by the light-reflecting layer 26 applies sufficient heat to the interface between the connecting electrode 103 and the terminal electrode 203, and the connecting electrode 103 and the terminal electrode 203 are melt bonded.

Although not shown, an alloy layer (eutectic alloy containing tin and gold) is formed between the connecting electrode 103 and the terminal electrode 203. In the present embodiment, the alloy layer composed of a eutectic alloy is formed between the connecting electrode 103 and the terminal electrode 203 so that the connecting electrode 103 and the terminal electrode 203 are firmly bonded to each other.

As described above, in the present embodiment, by irradiating laser light, the terminal electrode 203 of the connecting electrode 103 and the LED element 200 connected to the drive circuit 125 are melt bonded. At that time, the light-reflecting layer 26 arranged directly below the LED element 200 functions as a member for changing the optical path of the laser light 40. That is, the optical path of the laser light 40 transmitted through the semiconductor layer 202 and irradiated to the light-reflecting layer 26 is changed by the light-reflecting layer 26 and incident on the connecting electrode 103 via the insulating layer 27.

Figure 14:
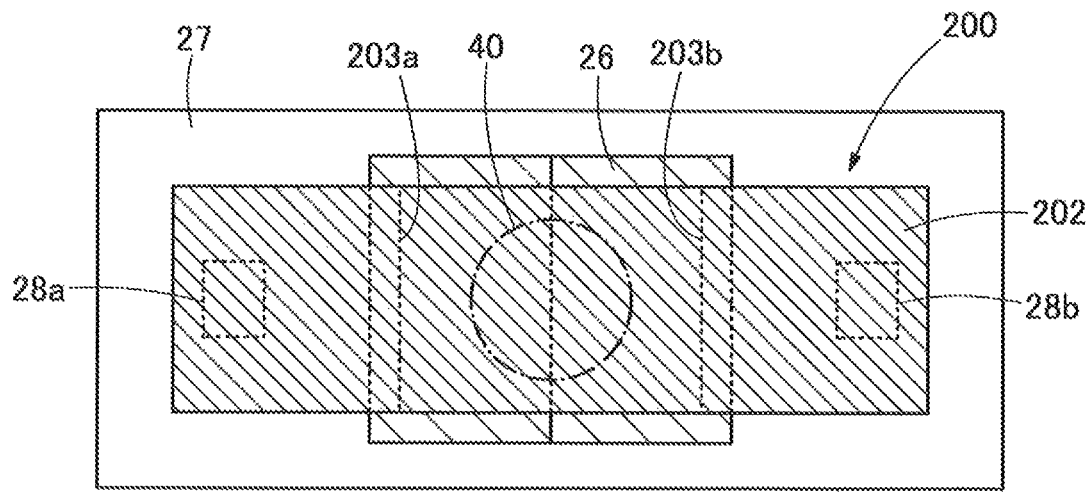
FIG. 14 is an enlarged plan view of a vicinity of an LED element in the pixel of the first embodiment of the present invention.

FIG. 14 is an enlarged plan view of a vicinity of the LED element 200 in the pixel 110 of the first embodiment. As shown in FIG. 14, in the present embodiment, since it is sufficient to irradiate the laser light 40 so as to hit the light-reflecting layer 26 directly below the semiconductor layer 202, a spot diameter of the laser light 40 can be set small. That is, according to the present embodiment, by reducing the spot diameter of the laser light 40, an energy density of the laser light 40 can be increased, and the laser light irradiation can be performed efficiently. Further, since the connecting electrode 103 can be efficiently heated by reflecting the light energy received by the light-reflecting layer 26, the loss of the light energy can be suppressed.

Figure 15:
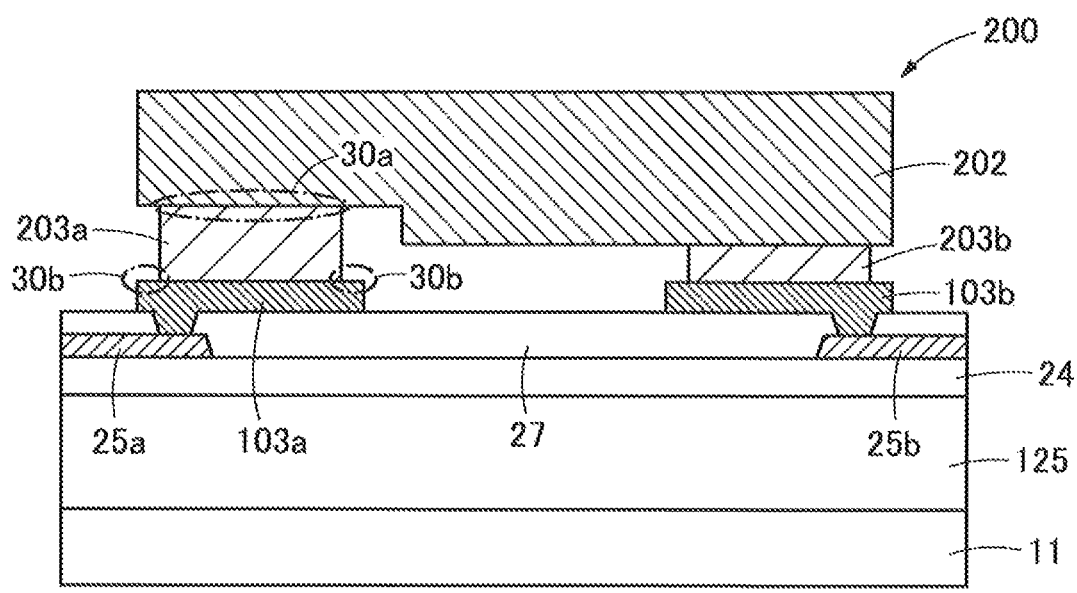
FIG. 15 is an enlarged cross-sectional view of a vicinity of an LED element in a pixel of a comparative example.

On the other hand, in a comparative example in which the light-reflecting layer 26 is not provided, the loss of the light energy of the laser light 40 is larger than that in the present embodiment. For example, FIG. 15 is an enlarged cross-sectional view of a vicinity of the LED element 200 in a pixel of the comparative example. As shown in FIG. 15, there is no layer that reflects the laser light (not shown) directly below the semiconductor layer 202, so that the irradiated laser light reaches the drive circuit 125 (not shown) located directly below the semiconductor layer 202. In this case, the laser light that reached the drive circuit 125 may adversely affect the semiconductor layer 12 of the drive transistor 127.

In the case where the laser light is irradiated so that the entire LED element 200 is in the range by increasing the spot diameter of the laser light, the laser light is reflected by the surface of the terminal electrode 203 made of gold (Au). In this case, an area 30a or area 30b shown by a chain line in FIG. 15 remains slightly heated, it is difficult to efficiently transfer heat to the junction of the connecting electrode 103 and the terminal electrode 203.

[Variation of Pixel Structure]

In the first embodiment, although a pixel structure in which the light-reflecting layer 26 having a substantially triangular-shaped cross-section is arranged has been described, the mode of the pixel structure is not limited to this example. Variations of other modes of pixel structure will be described below.

(Variation 1)

Figure 16:
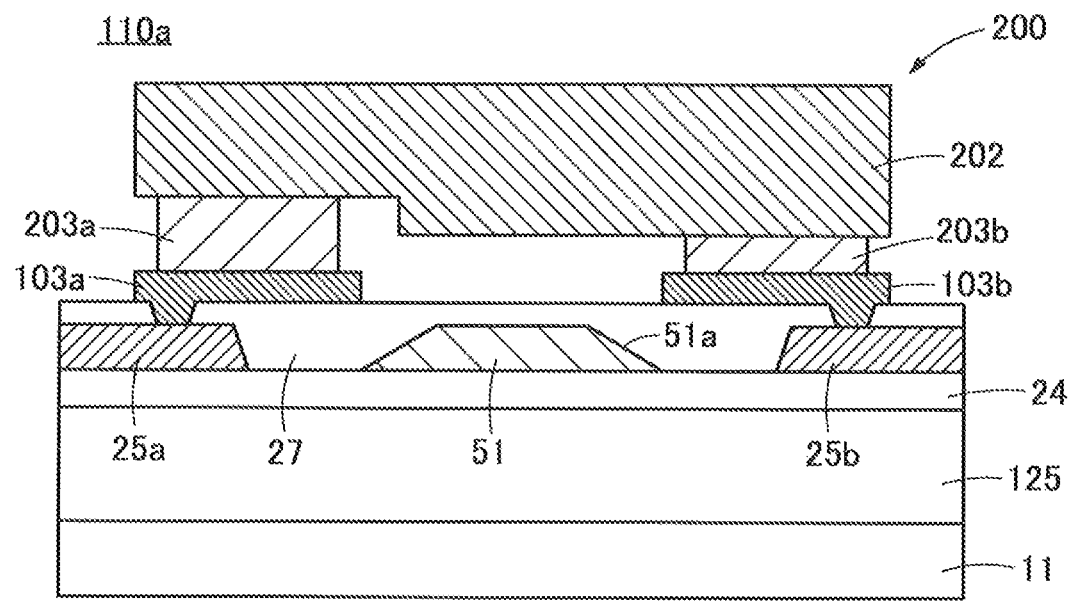
FIG. 16 is a cross-sectional view of a pixel configuration in variation 1 of the first embodiment of the present invention.

FIG. 16 is a cross-sectional view showing a configuration of a pixel 110a in variation 1 of the first embodiment of the present invention. In an example shown in FIG. 16, a metal layer in which the cross-section is substantially trapezoidal is used as the light-reflecting layer 51. Compared with the example shown in FIG. 4, the light-reflecting layer 51 has an advantage that the gradient of an inclined surface 51a can be increased while suppressing the thickness.

(Variation 2)

Figure 17:
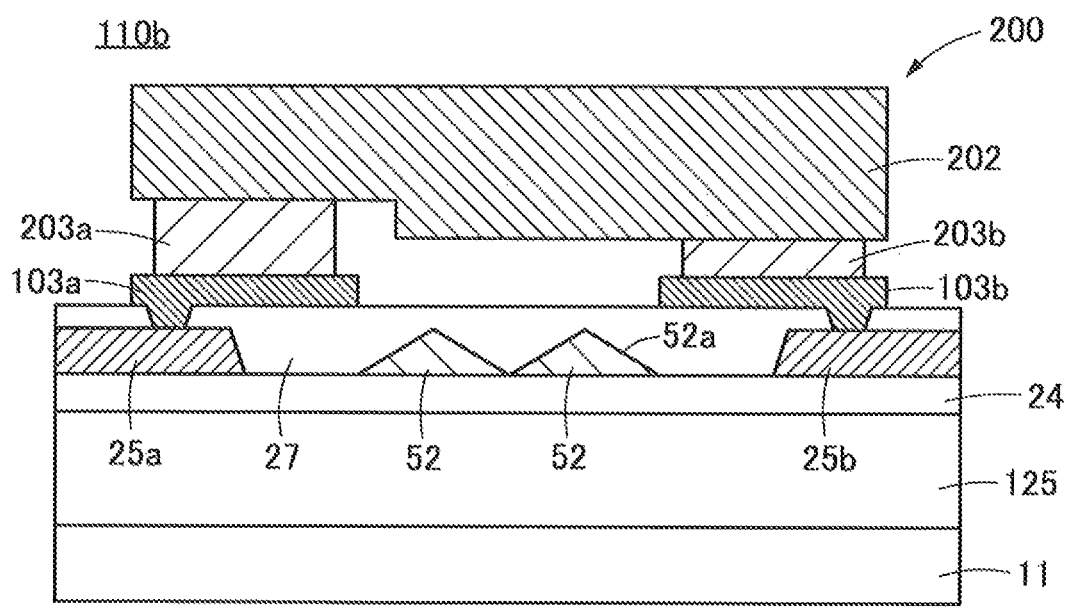
FIG. 17 is a cross-sectional view of a pixel configuration in variation 2 of the first embodiment of the present invention.

FIG. 17 is a cross-sectional view showing a configuration of a pixel 110b in variation 2 of the first embodiment of the present invention. In an example shown in FIG. 17, a plurality of light-reflecting layers 52 having a substantially triangular-shaped cross-section is arranged side by side. In FIG. 17, although an example in which the two light-reflecting layers 52 are arranged side by side is shown, the light-reflecting layer 52 may be provided two or more. Compared with the example shown in FIG. 4, the light-reflecting layer 52 has an advantage that the gradient of an inclined surface 52a can be increased while suppressing the thickness.

(Variation 3)

Figure 18:
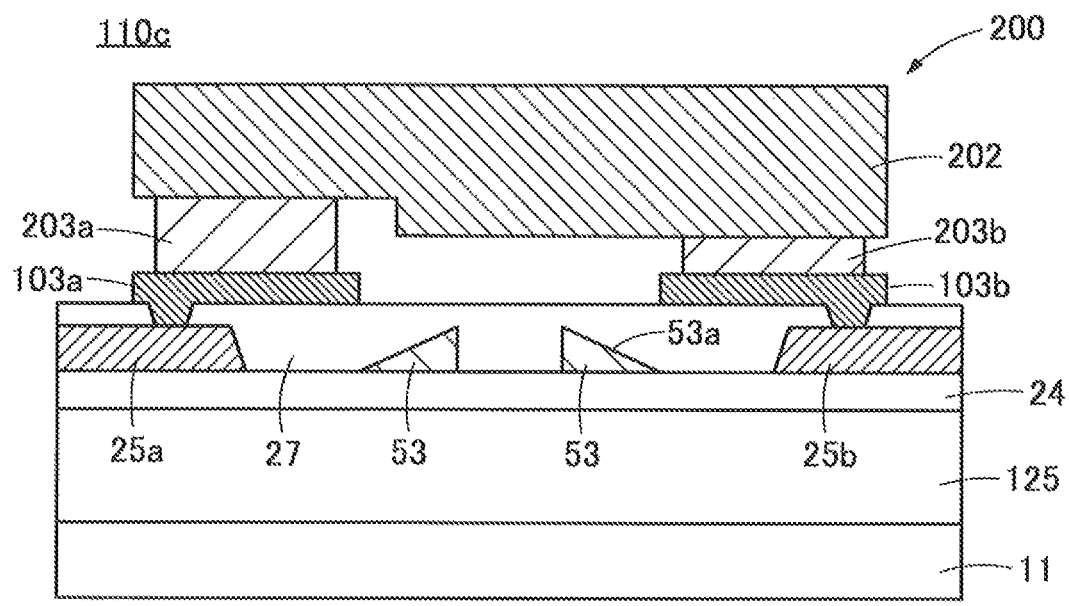
FIG. 18 is a cross-sectional view of a pixel configuration in variation 3 of the first embodiment of the present invention.

FIG. 18 is a cross-sectional view showing a configuration of a pixel 110c in variation 3 of the first embodiment of the present invention. In an example shown in FIG. 18, a plurality of light-reflecting layers 53 having a substantially right triangular-shaped cross-section is arranged side by side. Specifically, in FIG. 18, the two light-reflecting layers 53 are arranged apart from each other. The two light-reflecting layers 53 are arranged so that an inclined surfaces 53a face the connecting electrodes 103a and 103b. In FIG. 18, although an example in which the two light-reflecting layers 53 are arranged is shown, the light-reflecting layer 53 may be provided two or more. Compared with the example shown in FIG. 4, the light-reflecting layer 53 has an advantage that the gradient of the inclined surface 53a can be increased while suppressing the thickness.

(Variation 4)

Figure 19:
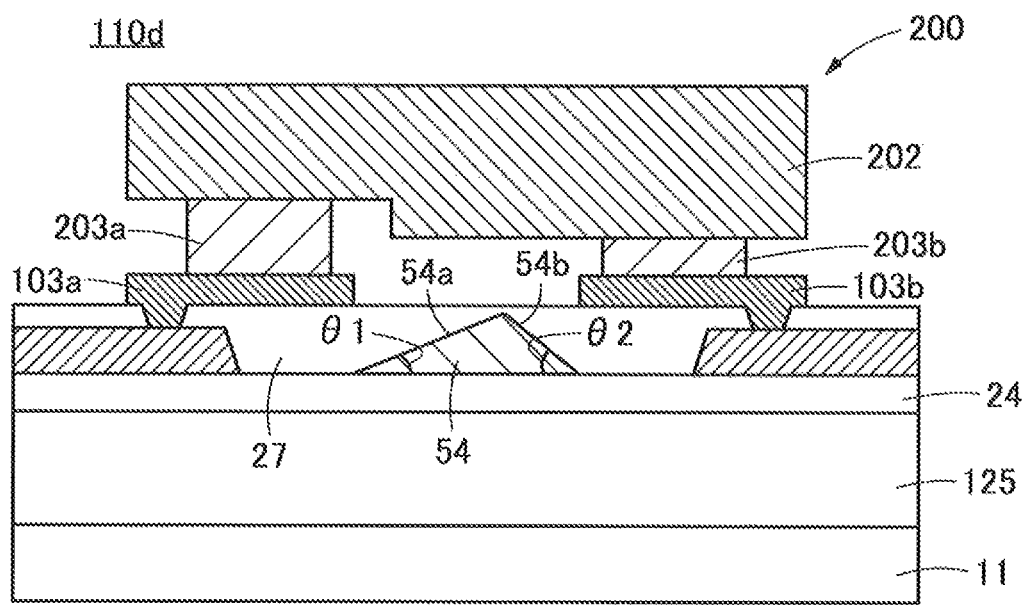
FIG. 19 is a cross-sectional view of a pixel configuration in variation 4 of the first embodiment of the present invention.

FIG. 19 is a cross-sectional view showing a configuration of a pixel 110d in variation 4 of the first embodiment of the present invention. In an example shown in FIG. 19, a metal layer having two inclined surfaces 54a and 54b having different gradients from each other is used as a light-reflecting layer 54. Specifically, in FIG. 19, a gradient (62) of the inclined surface 54b is larger than the gradient (01) of the inclined surface 54a. In this case, the amount of light of the laser light 40 incident on the connecting electrode 103a and the amount of light of the laser light 40 incident on the connecting electrode 103b can be made different.

(Variation 5)

Figure 20:
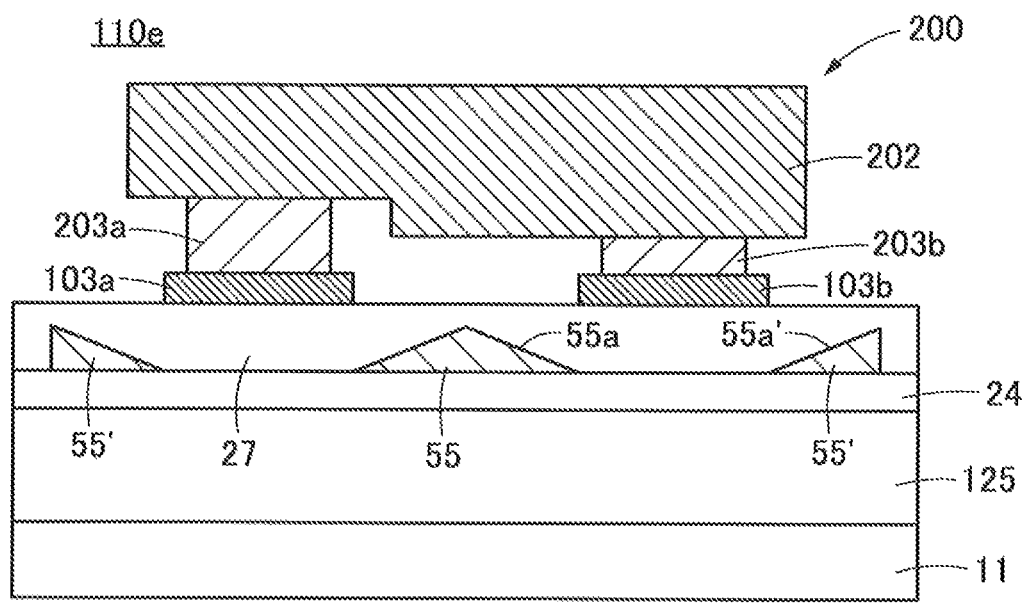
FIG. 20 is a cross-sectional view of a pixel configuration in variation 5 of the first embodiment of the present invention.

FIG. 20 is a cross-sectional view showing a configuration of a pixel 110e in variation 5 of the first embodiment of the present invention. In an example shown in FIG. 20, a structure in which a light-reflecting layer 55' is arranged in addition to the light-reflecting layer 55 is shown. Specifically, in FIG. 20, the light-reflecting layer 55 is arranged directly below the LED element 200 and a plurality of light-reflecting layers 55' is arranged at a position apart from the light-reflecting layer 55. In this case, in a plan view, the connecting electrode 103 is located between the light-reflecting layer 55 and the light-reflecting layer 55'. In the present embodiment, the mounting pad 25 is omitted for convenience of description.

In the example shown in FIG. 20, the laser light 40 transmitted through the LED element 200 is reflected by the inclined surface 55a of the light-reflecting layer 55 and is incident on the connecting electrode 103. Furthermore, the laser light 40 leaking around the LED element 200 (i.e., the laser light 40 that is incident on the insulating layer 27 without hitting the LED element 200) is reflected by an inclined surface 55a' of the light-reflecting layer 55' and incident on the connecting electrode 103.

As a result, in the present variation, in the case where the irradiation range of the laser light 40 is larger than the LED element 200, the laser light that has not hit the LED element 200 can also be reflected toward the connecting electrode 103. Therefore, the energy loss of the laser light 40 can be suppressed, and the influence of the laser light 40 on the drive circuit 125 can be reduced.

In the present embodiment, although an example of using a metal layer having a substantially right triangle shape as the light-reflecting layer 55' is shown, the present invention is not limited to this example, and the shapes of the light-reflecting layer 55 and the light-reflecting layer 55' may be the same.

(Variation 6)

Figure 21:
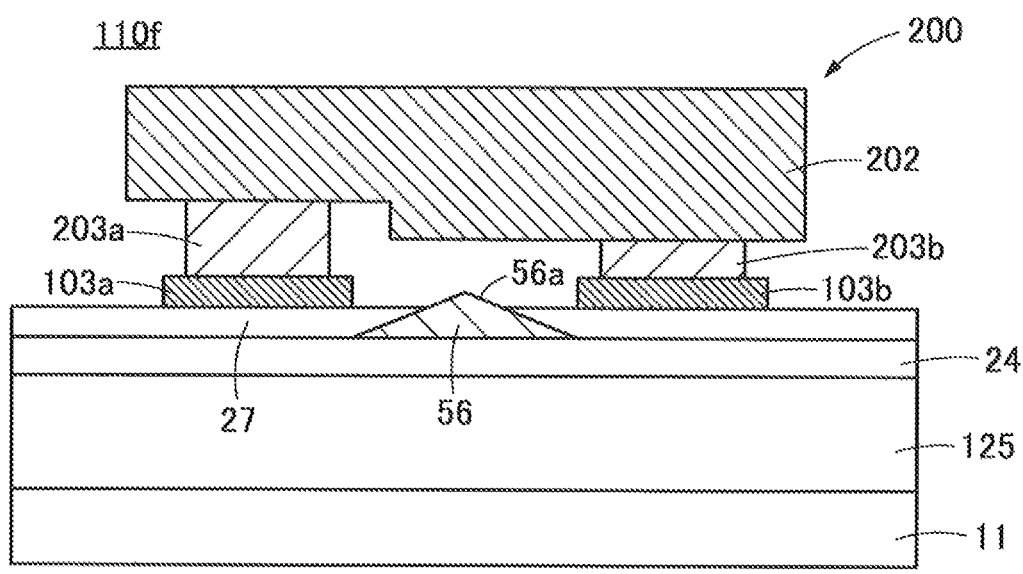
FIG. 21 is a cross-sectional view of a pixel configuration in variation 6 of the first embodiment of the present invention.

FIG. 21 is a cross-sectional view showing a configuration of a pixel 110f in variation 6 of the first embodiment of the present invention. In an example shown in FIG. 21, the thickness of the insulating layer 27 is thinner than the thickness of the light-reflecting layer 56. That is, the light-reflecting layer 56 has a structure in which a part of the upper part thereof is exposed from the insulating layer 27. In the present embodiment, the mounting pad 25 is omitted for convenience of description.

In the present variation, since the thickness of the insulating layer 27 can be set regardless of the thickness of the light-reflecting layer 56, compared with the example shown in FIG. 4, it has an advantage that the gradient of an inclined surface 56a of the light-reflecting layer 56 can be increased while suppressing the thickness of the insulating layer 27.

(Variation 7)

In the first embodiment described above (including variations 1 to 6), although an example in which the cross-section of the light-reflecting layer is polygonal has been described, the present invention is not limited to this example. For example, the inclined surface of the light-reflecting layer may be a curved surface. In this case, the curved surface may be a concave surface or a convex surface.

Second Embodiment

In the present embodiment, a display device having a pixel configuration different from that of the first embodiment will be described. In the present embodiment, portions different from those of the first embodiment will be described. In the drawings used in the description of the present embodiment, the same components as those of the first embodiment are denoted by the same symbols, and detailed description thereof is omitted.

Figure 22:
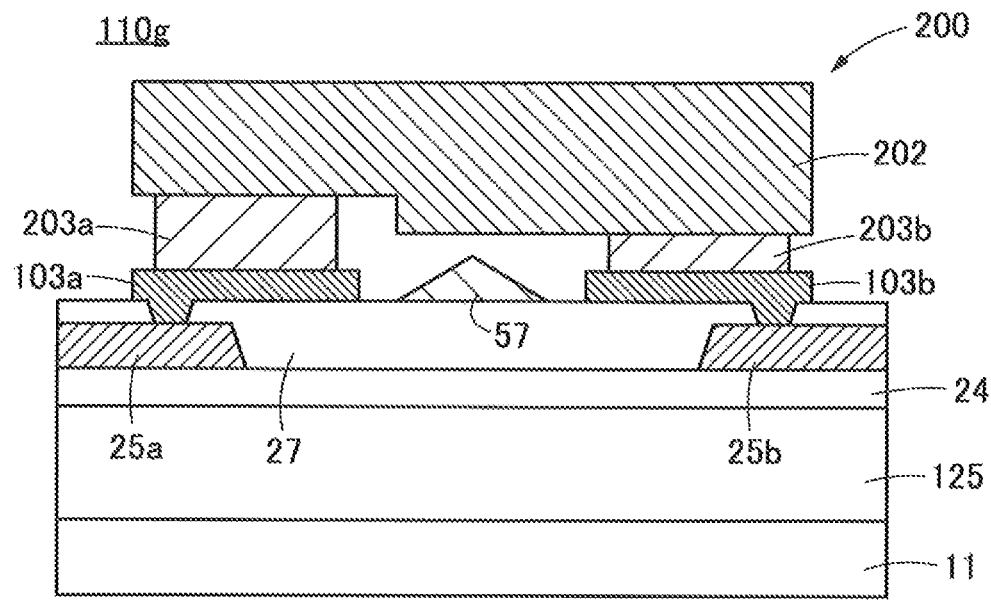
FIG. 22 is a cross-sectional view of a pixel configuration in a display device of a second embodiment of the present invention.

FIG. 22 is a cross-sectional view showing a configuration of a pixel 110g in a display device according to a second embodiment. Although an example shown in FIG. 22 is similar to the pixel 110 shown in FIG. 4, a light-reflecting layer 57 is provided on the same layer as the connecting electrode 103. Specifically, the light-reflecting layer 57 is arranged between the connecting electrode 103a and the connecting electrode 103b so as not to cause a short circuit.

Figure 23:
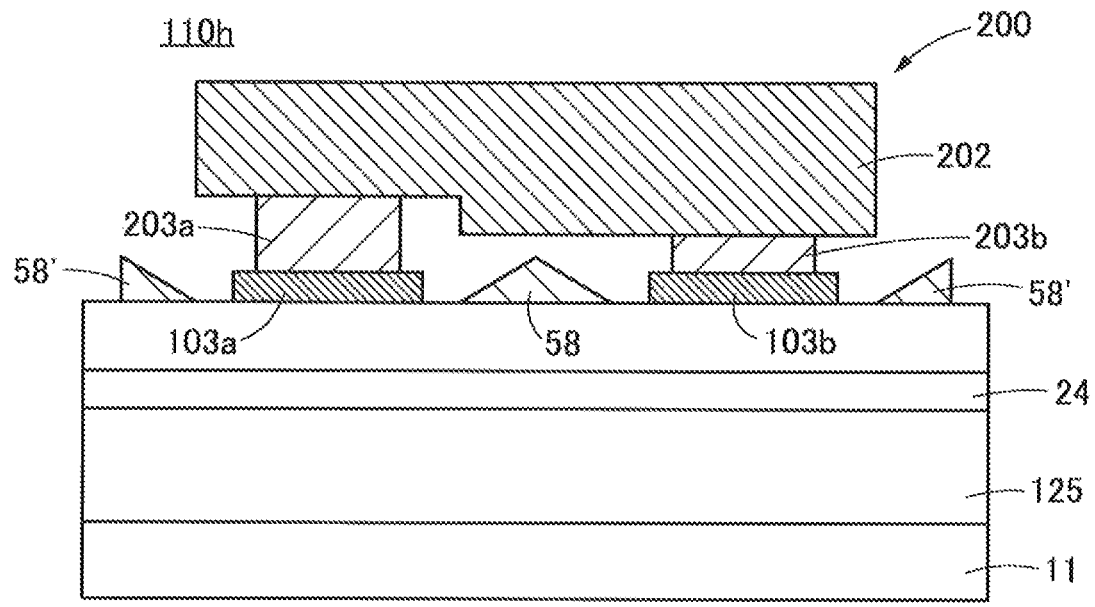
FIG. 23 is a cross-sectional view of a pixel configuration in variation of the second embodiment of the present invention.

FIG. 23 is a cross-sectional view showing a configuration of a pixel 110h in a display device according to the second embodiment. Although an example shown in FIG. 23 is similar to the pixel 110e shown in FIG. 20, a light-reflecting layer 58 and light-reflecting layers 58' are provided on the same layer as the connecting electrode 103. Specifically, the light-reflecting layer 58 is arranged between the connecting electrode 103a and the connecting electrode 103b so as not to cause a short circuit. The light-reflecting layers 58' are arranged at a position apart from the light-reflecting layer 58. In this case, in a plan view, the connecting electrode 103 is located between the light-reflecting layer 58 and the light-reflecting layers 58'.

In the present embodiment, although an alloy material containing copper is used as the light-reflecting layer 57, the light-reflecting layer 58, and the light-reflecting layer 58', other metal materials described in the first embodiment may be used. In the present embodiment, in order to form the connecting electrode 103 using tin (Sn), the light-reflecting layer 57, the light-reflecting layer 58, and the light-reflecting layer 58' are formed by a process different from that of the connecting electrode 103.

In the present embodiment, although an example in which the insulating layer 27 is provided so as to cover the mounting pad 25 is shown, the present invention is not limited to this example, and the insulating layer 27 may be omitted. That is, the connecting electrode 103 may be provided directly on the mounting pad 25. In this case, since the insulating layer 27 as the planarization layer can be omitted, the thickness of the circuit substrate can be reduced.

Third Embodiment

In the present embodiment, a display device having a pixel configuration different from that of the first embodiment will be described. In the present embodiment, portions different from those of the first embodiment will be described. In the drawings used in the description of the present embodiment, the same components as those of the first embodiment are denoted by the same symbols, and detailed description thereof is omitted.

Figure 24:
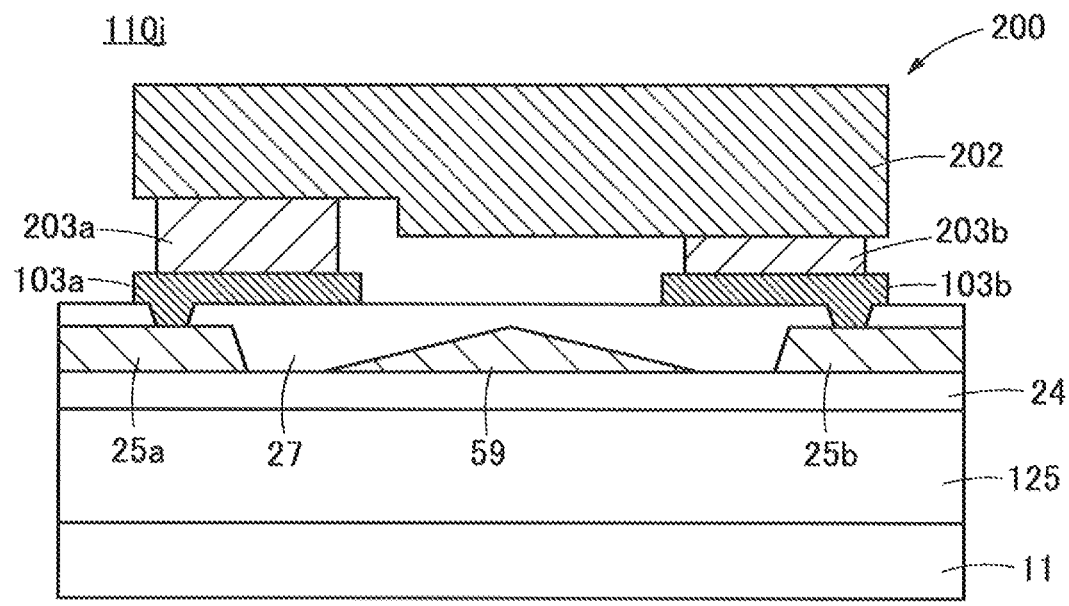
FIG. 24 is a cross-sectional view of a pixel configuration in a display device of a third embodiment of the present invention.

FIG. 24 is a cross-sectional view showing a configuration of a pixel 110j in a display device according to a third embodiment. Although an example shown in FIG. 24 is similar to the pixel 110 shown in FIG. 4, the mounting pad 25 and a light-reflecting layer 59 are made of the same metal material. Specifically, the mounting pad 25 and the light-reflecting layer 59 are composed of a metal material containing copper (e.g., a copper alloy).

In the present embodiment, since a metal material containing copper having excellent conductivity is used, a resistance of the mounting pad 25 can be reduced while maintaining a reflectance of the light-reflecting layer 59 with respect to infrared light (laser light) of 90% or more. Since the mounting pad 25 and the light-reflecting layer 59 can be formed of the same metal material, the manufacturing process can be simplified. In this case, since the surface of the mounting pad 25 also exhibits a high reflectance with respect to the infrared light, even when the irradiation area of the infrared light is wider than the LED element 200, the incidence of the infrared light on the drive circuit 125 can be suppressed.

Fourth Embodiment

In the present embodiment, a display device having a pixel configuration different from that of the first embodiment will be described. In the present embodiment, portions different from those of the first embodiment will be described. In the drawings used in the description of the present embodiment, the same components as those of the first embodiment are denoted by the same symbols, and detailed description thereof is omitted.

Figure 25:
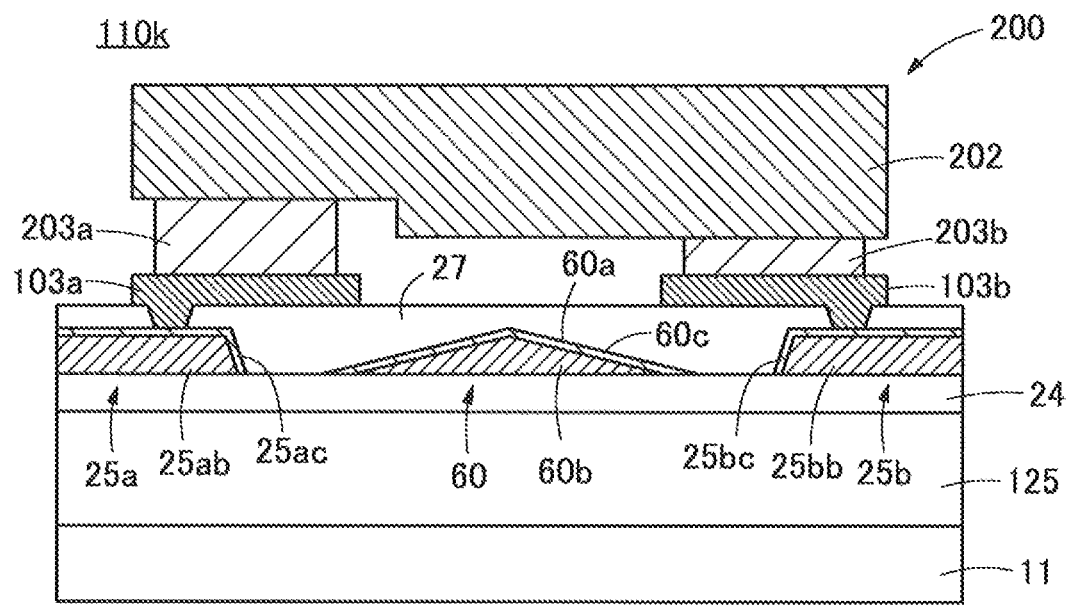
FIG. 25 is a cross-sectional view of a pixel configuration in a display device of a fourth embodiment of the present invention.

FIG. 25 is a cross-sectional view showing a configuration of a pixel 110k in a display device according to a fourth embodiment. Although an example shown in FIG. 25 is similar to the pixel 110 shown in FIG. 4, a light-reflecting layer 60 has a structure in which two different metal layers are stacked. Specifically, the light-reflecting layer 60 includes a metal layer 60b and a metal layer 60c covering the metal layer 60b. That is, the light-reflecting layer 60 has a structure in which a surface of the metal layer 60b is coated with the metal layer 60c. That is, an inclined surface 60a of the light-reflecting layer 60 is composed of the metal layer 60c.

In the present embodiment, the metal layer 60b is formed using a metal material including tantalum, tungsten, molybdenum, titanium, or aluminum. Therefore, body of the light-reflecting layer 60 is composed of the metal layer 60b. On the other hand, the metal layer 60c is formed using a metal material including gold, silver, copper, or aluminum. Therefore, the inclined surface 60a which functions as a reflecting surface is composed of the metal layer 60c. The inclined surface 60a of the light-reflecting layer 60 is formed along the inclined surface provided in the metal layer 60b.

To explain an example of forming the pixel structure of the present embodiment, first, a metal layer containing tantalum is formed on the insulating layer 24, and then the metal layer 60b is formed by patterning using photolithography. At this point, the metal layer 60b has an inclined surface. Thereafter, the metal layer 60c containing gold is formed on the surface of the metal layer 60b by, for example, an electroplating method. Therefore, the inclined surface of the metal layer 60b is covered with the metal layer 60c. Through such a process, the inclined surface 60a of the light-reflecting layer 60 functions as a reflecting surface made of a metal material containing gold.

According to the present embodiment, the metal layer 60b, which is the body of the light-reflecting layer 60, can be formed of an inexpensive metal material. Therefore, it is sufficient to form the metal layer 60c with a thickness of a degree that can function as a reflecting surface. Therefore, even if a metal material containing expensive gold is used as the metal layer 60c, the manufacturing cost of the display device can be suppressed.

The mounting pads 25a and 25b can be formed in the same layer as the light-reflecting layer 60 by the same process. That is, the mounting pad 25a is formed of a stacked structure of a metal layer 25ab and a metal layer 25ac. The mounting pad 25b is formed of a stacked structure of a metal layer 25bb and a metal layer 25bc. In this case, since the surface of the mounting pad 25 also exhibits a high reflectance with respect to the infrared light, even when the irradiation area of the infrared light is wider than the LED element 200, the incidence of the infrared light on the drive circuit 125 can be suppressed.

Each of the embodiments (including the variation) described above as an embodiment of the present invention can be appropriately combined and implemented as long as they do not contradict each other. The addition, deletion, or design change of components as appropriate, or the addition, deletion, or condition change of processes by those skilled in the art based on each embodiment are also included in the scope of the present invention as long as they are provided with the gist of the present invention.

Further, it is understood that, even if the effect is different from those provided by each of the above-described embodiments, the effect obvious from the description in the specification or easily predicted by the person skilled in the art is apparently derived from the present invention.

What is claimed is:

1. A display device comprising:
   a drive circuit on an insulating substrate;
   a connecting electrode electrically connected to the drive circuit;
   an LED element electrically connected to the drive circuit via the connecting electrode, and a first light reflecting layer overlapping the LED element and having an inclined surface, wherein the inclined surface reflects light incident on the inclined surface through the LED element toward the connecting electrode.

2. The display device according to claim 1, wherein the first light reflecting layer has a reflectance of 90 percent or more for light at a wavelength of 1.0 μm or more to 1.5 μm or less.

3. The display device according to claim 1, wherein the first light reflecting layer has a metal layer containing gold, silver, copper, or aluminum.

4. The display device according to claim 3, wherein the first light reflecting layer has a first metal layer and a second metal layer covering the first metal layer, and the second metal layer is a metal layer containing gold, silver, copper, or aluminum.

5. The display device according to claim 1, further comprising:

a second light reflecting layer located at a distance from the first light reflecting layer, wherein the connecting electrode is located between the first light reflecting layer and the second light reflecting layer in a plan view.

6. The display device according to claim 1, further comprising:

an insulating layer covering the first light reflecting layer, wherein the connecting electrode is provided on the insulating layer.

7. The display device according to claim 1, wherein the connecting electrode overlaps on a part of the first light reflecting layer in a plan view.

* * * * *